(12) United States Patent
Tomita et al.

(10) Patent No.: US 8,471,477 B2
(45) Date of Patent: Jun. 25, 2013

(54) SUBSTRATE PROCESSING APPARATUS AND METHOD OF MANUFACTURING SEMICONDUCTOR DEVICE

(75) Inventors: Masayuki Tomita, Toyama (JP); Katsunori Funaki, Toyama (JP); Shinji Yashima, Toyama (JP); Ryuichi Shimada, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 314 days.

(21) Appl. No.: 13/071,227

(22) Filed: Mar. 24, 2011

(65) Prior Publication Data

US 2011/0234100 A1    Sep. 29, 2011

(30) Foreign Application Priority Data

Mar. 26, 2010   (JP) .................................. 2010-071872

(51) Int. Cl.
*H05B 31/26* (2006.01)
(52) U.S. Cl.
USPC ............. 315/111.21; 315/111.31; 315/111.71
(58) Field of Classification Search
USPC ............. 315/111.21, 111.31, 111.41, 111.51, 315/111.61, 111.71
See application file for complete search history.

(56) References Cited

U.S. PATENT DOCUMENTS

| | | | |
|---|---|---|---|
| 6,026,762 A * | 2/2000 | Kao et al. ............... | 118/723 ME |
| 6,029,602 A * | 2/2000 | Bhatnagar .............. | 118/723 ME |
| 6,174,450 B1 * | 1/2001 | Patrick et al. .................... | 216/61 |
| 6,818,562 B2 * | 11/2004 | Todorow et al. .............. | 438/710 |
| 7,415,940 B2 * | 8/2008 | Koshimizu et al. ....... | 118/723 E |
| 7,967,944 B2 * | 6/2011 | Shannon et al. ......... | 156/345.28 |
| 8,264,154 B2 * | 9/2012 | Banner et al. ............ | 315/111.71 |
| 2004/0045506 A1 * | 3/2004 | Chen et al. .................. | 118/723 I |
| 2004/0107906 A1 * | 6/2004 | Collins et al. .............. | 118/723 I |
| 2006/0220574 A1 * | 10/2006 | Ogawa ..................... | 315/111.21 |

* cited by examiner

*Primary Examiner* — Jason M Crawford
(74) *Attorney, Agent, or Firm* — Volpe and Koenig, P.C.

(57) ABSTRACT

A processing speed may be easily controlled over the wide range within the impedance variation range. A substrate processing apparatus includes: a processing chamber configured to process a substrate; a substrate support unit configured to support the substrate in the processing chamber; a processing gas supply unit configured to supply a processing gas into the processing chamber; a plasma generation electrode configured to convert the processing gas supplied into the processing chamber to be in a plasma state; a radio frequency power source configured to apply a radio frequency power to the plasma generation electrode; a variable impedance electrode installed at the substrate support unit and configured to control an electric potential of the substrate; a variable impedance mechanism connected to the variable impedance electrode and configured to vary an impedance according to a reciprocal of a peak-to-peak voltage of the plasma generation electrode; an exhaust unit configured to exhaust an atmosphere in the processing chamber; and a controller configured to control at least the variable impedance mechanism.

10 Claims, 12 Drawing Sheets

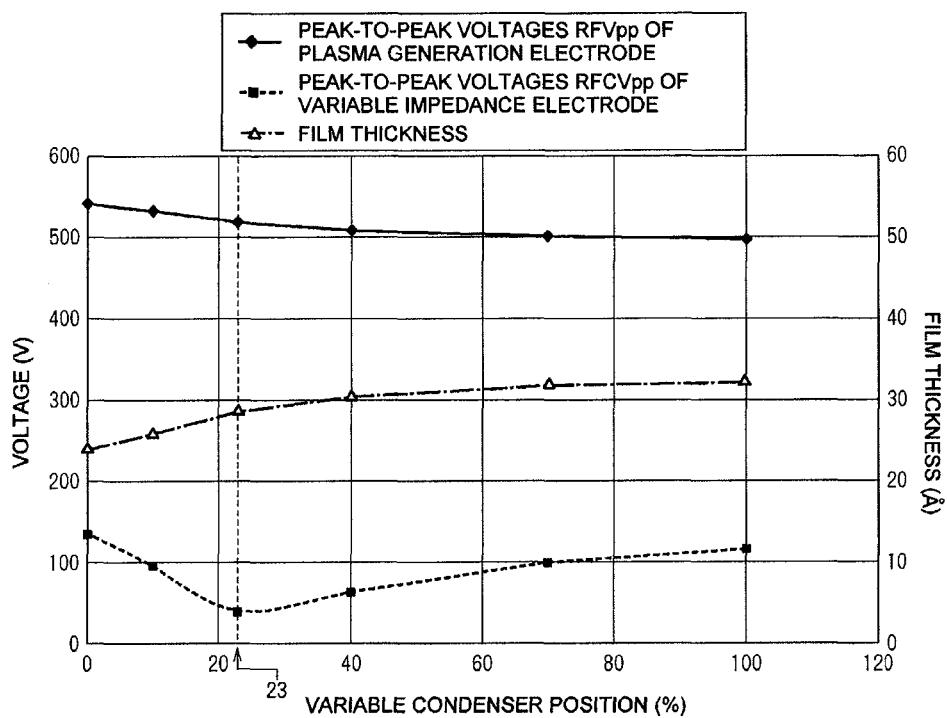

SUBSTRATE PROCESSING APPARATUS AND METHOD OF MANUFACTURING SEMICONDUCTOR DEVICE

CROSS-REFERENCE TO RELATED PATENT APPLICATION

This application claims priority to and the benefit of Japanese Patent Application No. 2010-071872 filed on Mar. 26, 2010, the disclosure of which is incorporated herein by reference.

FIELD OF THE INVENTION

The present invention relates to a substrate processing apparatus for processing a substrate using plasma and a method of manufacturing a semiconductor device.

DESCRIPTION OF THE RELATED ART

As one of processes of manufacturing a semiconductor device such as a DRAM (dynamic random access memory), a substrate processing process for forming a film on a substrate using plasma is performed. A conventional substrate processing apparatus for performing the substrate processing process includes a plasma generation electrode for transform a processing gas supplied into a processing chamber to be in a plasma state, a radio frequency (RF) power source for applying a radio frequency power to the plasma generation electrode, a substrate support unit for supporting a substrate in the processing chamber, a variable impedance electrode installed at the substrate support unit, a variable impedance mechanism connected to the variable impedance electrode and configured to vary an impedance and a controller for controlling at least the variable impedance mechanism.

A processing speed by plasma may be controlled by varying an electric potential of a substrate with respect to plasma, that is, an electric potential of the variable impedance electrode. The electric potential of the variable impedance electrode may be controlled by varying an impedance of the variable impedance mechanism. When the impedance is varied, not only the electric potential of the substrate but also a peak-to-peak voltage of the variable impedance electrode and a peak-to-peak voltage of the plasma generation electrode are varied. In view of the fact that the variation in the peak-to-peak voltage of the variable impedance electrode exhibits a similar tendency to a variation in the processing speed, the conventional substrate processing apparatus monitors the variation in the peak-to-peak voltage of the variable impedance electrode and vary the impedance based on the monitored result to control the processing speed.

However, the variation in the peak-to-peak voltage of the variable impedance electrode exhibits a similar tendency to the variation in processing speed within a certain range of the impedance variation, but not over a wide range of the impedance variation. Accordingly, when the impedance of the variable impedance mechanism is varied over the wide range, even if the variation in the peak-to-peak voltage of the variable impedance electrode is monitored, controlling the processing speed to a desired value is difficult.

SUMMARY OF THE INVENTION

An object of the present invention is to provide a substrate processing apparatus and a method of manufacturing a semiconductor device by which a processing speed may be easily controlled over a wide area within an impedance variation range.

According to a first embodiment of the present invention, there is provided a substrate processing apparatus comprising: a processing chamber configured to process a substrate; a substrate support unit configured to support the substrate in the processing chamber; a processing gas supply unit configured to supply a processing gas into the processing chamber; a plasma generation electrode configured to convert the processing gas supplied into the processing chamber to be in a plasma state; a radio frequency power source configured to apply a radio frequency power to the plasma generation electrode; a variable impedance electrode installed at the substrate support unit and configured to control an electric potential of the substrate; a variable impedance mechanism connected to the variable impedance electrode and configured to vary an impedance according to a reciprocal of a peak-to-peak voltage of the plasma generation electrode; an exhaust unit configured to exhaust an atmosphere in the processing chamber; and a controller configured to control at least the variable impedance mechanism.

According to a second embodiment of the present invention, there is provided a method of manufacturing a semiconductor device including steps of: converting, by a plasma generation unit, a processing gas supplied into a processing chamber to be in a plasma state with a capacitance of a varying condenser set according to a reciprocal of a peak-to-peak voltage of a variable impedance mechanism to control the variable impedance mechanism to a desired impedance; exposing a substrate in the processing chamber to the plasma and processing the substrate; and unloading the processed substrate from the processing chamber.

According to the substrate processing apparatus and the method of manufacturing the semiconductor device of the present invention, the processing speed can be easily controlled over the wide range of the impedance variation.

BRIEF DESCRIPTION OF THE DRAWINGS

FIG. 12 is a graph showing variations in a peak-to-peak voltage of a plasma generation electrode, a peak-to-peak voltage of a variable impedance electrode and a film thickness relative to a variable condenser position.

DETAILED DESCRIPTION OF THE PREFERRED EMBODIMENTS

One Embodiment of the Present Invention

A substrate processing apparatus according to the present embodiment is configured as a substrate processing apparatus (hereinafter, referred to as an MMT apparatus) for plasma-processing a substrate using a modified-magnetron-type ("MMT") plasma source. The MMT apparatus applies a radio frequency (RF) power to a plasma generation electrode to form an electric field, and simultaneously forms a magnetic field to generate a magnetron discharge. Thus, electrons emitted from the plasma generation electrode continue circulating in a cycloid motion while drifting such that an ion generation rate may increase due to a long lifespan. Accordingly, the MMT apparatus may generate a high-density plasma. The MMT apparatus may perform different types of plasma processing on the substrate by nitriding or oxidizing the substrate surface or a thin film formed on the substrate by exciting and decomposing the processing gas, forming a thin film on the substrate, and etching the substrate surface.

Hereinafter, the configuration of the substrate processing apparatus according to the present embodiment will be described in detail.

(1) Configuration of Substrate Processing Apparatus

Figure 1:
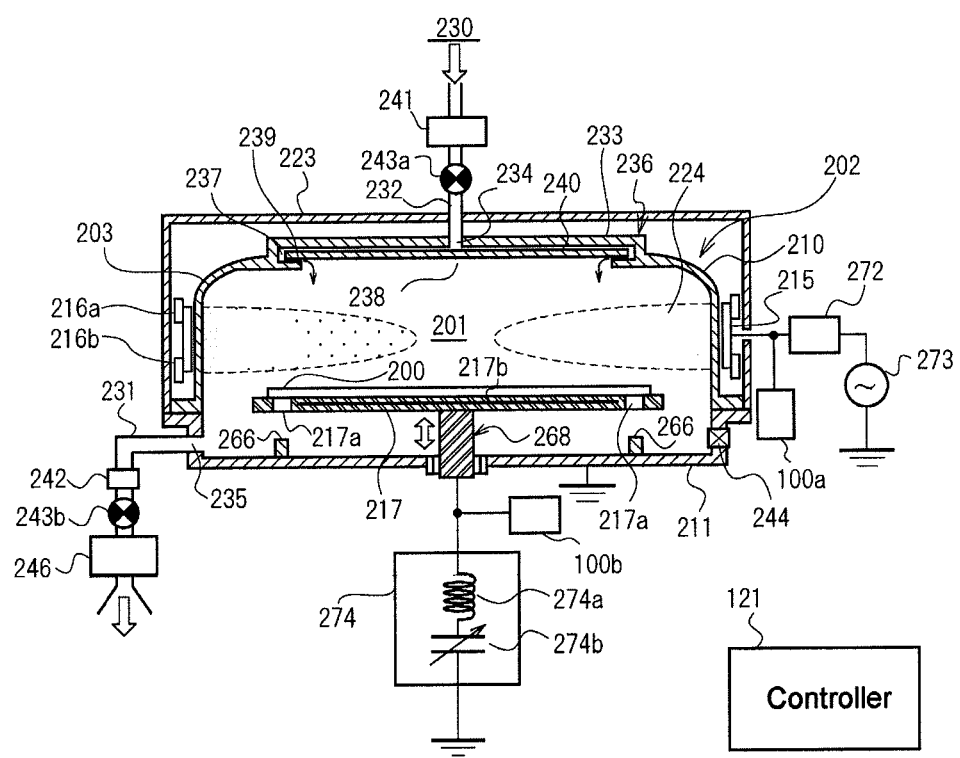
FIG. 1 is a longitudinal sectional view showing a main structure of a substrate processing apparatus according to a first embodiment of the present invention.

FIG. 1 is a longitudinal sectional view of a substrate processing apparatus according to the present embodiment. The substrate processing apparatus includes a processing furnace 202 for plasma-processing a wafer 200 as a substrate. The processing furnace 202 includes a processing container 203. The processing container 203 includes a dome-shaped upper container 210 and a vessel-type lower container 211. The upper container 210 is made of a non-metallic material, such as aluminum oxide ($Al_2O_3$) or quartz ($SiO_2$). The lower container 211 may be made of, for example, aluminum (Al). The lower container 211 is covered with the upper container 210. The processing chamber 201 is hermetically sealed with the upper and lower containers 210 and 211. A shielding plate 223 for efficiently shielding an electric field or magnetic field is installed along an outer circumference of the upper container 210 so as not to affect outer circumstances or other apparatuses, such as processing furnaces.

At least three wafer elevating pins 266 for pushing the wafer 200 with respect to a susceptor 217 to be described later are installed at a bottom surface of the lower container 211. Also, a gate valve 244 is installed at a sidewall of the lower container 211. When the gate valve 244 is opened, the wafer 200 is capable of being transferred into the processing chamber 201 by a transfer mechanism (not shown), and when the gate valve 244 is closed, an inside of the processing chamber 201 may be hermetically sealed. Also, the gate valve 244 is connected to a controller 121 which is to be described later.

(Processing Gas Supply Unit)

A shower head 236 is installed at an upper portion of the processing chamber 201. The shower head 236 includes a cap-shaped cover 233, a gas introduction port 234, a gas buffer chamber 237, a gas opening 238, a shielding plate 240 and a gas outlet 239. A downstream end of a gas supply pipe 232 is connected to the gas introduction port 234. A gas supply source (not shown) configured to supply a processing gas 230 or an inert gas, a mass flow controller 241 and a valve 243a are installed in sequence from an upstream side at the gas supply pipe 232. The gas buffer chamber 237 is installed as a dispersion space in which gases introduced from the gas introduction port 234 are dispersed. Mainly, the processing gas supply unit includes the gas supply pipe 232, the mass flow controller 241, the valve 243a and the shower head 236. Also, the mass flow controller 241 and the valve 243a are connected to the controller 121 which is to be described later.

(Exhaust Unit)

A gas exhaust port 235 is installed at a lower portion of the sidewall of the lower container 211. An upstream end of a gas exhaust pipe 231 is connected to the gas exhaust port 235. An automatic pressure controller (APC) 242 serving as a pressure adjuster, a valve 243b serving as an opening/closing valve and a vacuum pump 246 serving as an exhaust apparatus are installed in sequence from the upstream side at the gas exhaust pipe 231. Also, the APC 242 is capable of vacuumizing or stop vacuumizing the processing chamber 201 by opening and closing the valve and adjusting pressure by controlling an opening degree of the valve. While operating the vacuum pump 246 to control the opening degree of the APC 242 based on a pressure detected by a pressure sensor (not shown), the APC 242 is capable of vacuumizing the processing chamber 201 such that an inner atmosphere of the processing chamber 201 is adjusted to have a predetermined pressure (degree of vacuum). Also, the shielding plate 240 and the lower container 211 are grounded. Mainly, an exhaust unit includes the pressure sensor, the gas exhaust pipe 231, the APC 242, the valve 243b, and the vacuum pump 246. In addition, the APC 242, the valve 243b, the vacuum pump 246 and the pressure sensor are connected to the controller 121 which is to be described later.

(Plasma Generation Unit)

A plasma generation electrode 215 having a tubular shape, for example, a cylindrical shape, is installed as a discharge mechanism at an outer circumferential side of the processing container 203 (the upper container 210). The plasma generation electrode 215 surrounds a plasma generation region 224 in the processing chamber 201. An RF power source 273 for applying a RF power is connected to the plasma generation electrode 215 via an impedance matching device 272 for adjusting an impedance. A voltage measuring unit 100a for measuring a peak-to-peak voltage of the plasma generation electrode 215 is connected between the plasma generation electrode 215 and the impedance matching device 272. The voltage measuring unit 100a includes, for example, an oscilloscope or a plasma monitor. Data such as the peak-to-peak voltage of the plasma generation electrode 215 measured by the voltage measuring unit 100a is output to the controller 121 which is to be described later. Mainly, the plasma generation unit includes the plasma generation electrode 215, the impedance matching device 272 and the RF power source 273. Also, the voltage measuring unit 100a, the impedance matching device 272 and the RF power source 273 are connected to the controller 121 which is to be described later.

An upper magnet 216a and a lower magnet 216b having a tubular shape, for example, a cylindrical shape as magnetic-field forming mechanisms are disposed in the vicinity of upper and lower ends of an outer surface of the plasma generation electrode 215. Each of the upper and lower magnets 216a and 216b includes, for example, a permanent magnet. Each of the upper and lower magnets 216a and 216b has magnetic poles at both ends (inner and outer circumferential ends) thereof according to a radial direction of the processing chamber 201. The upper and lower magnets 216a and 216b are installed in a manner that directions of magnetic poles thereof are opposite to each other. The magnetic poles at inner circumferential portions of the upper and lower magnets 216a and 216b are opposite to each other. Thus, a line of magnetic force may be formed in a cylindrical axial direction along inner circumferential surfaces of the upper and lower magnets 216a and 216b.

(Susceptor)

A susceptor 217 is disposed as a substrate support unit for supporting the wafer 200 in the center of a lower side of the processing chamber 201. The susceptor 217 is made of, for example, aluminum nitride (AlN) or a non-metallic material, such as ceramics or quartz. Thus, contamination of the wafer 200 with metals from the susceptor 217 may be reduced during plasma generation for processing a substrate to be described later. Also, the susceptor 217 is electrically insulated from the lower container 211. A heater (not shown) serving as a heating mechanism for heating the wafer 200 is integrally buried in the susceptor 217. By applying power from a power unit (not shown) to the heater, the wafer 200 may be heated from, for example, room temperature to a temperature of about 1,000° C. Also, a temperature sensor (not shown) is installed at the susceptor 217. The power unit and the temperature sensor are connected to the controller 121 which is to be described later. A conduction state from the power unit to the heater is controlled by feedback based on temperature information detected by the temperature sensor.

A susceptor elevating mechanism 268 for elevating the susceptor 217 is installed under the center of the susceptor 217. Also, at least three through holes 217a are formed at a peripheral side of the susceptor 217. The wafer elevating pins 266 are capable of penetrating the through holes 217a. The wafer elevating pins 266 and the through holes 217a have a position relationship such that when the susceptor 217 is lowered by the susceptor elevating mechanism 268, the wafer elevating pins 266 penetrate the through holes 217a in a non-contacting manner. In addition, the susceptor elevating mechanism 268 is connected to the controller 121 which is to be described later.

In addition, a variable impedance electrode 217b for controlling an electric potential of the wafer 200 is installed inside the susceptor 217. The variable impedance electrode 217b is grounded via a variable impedance mechanism 274 capable of varying the impedance thereof. The variable impedance mechanism 274 includes a coil 274a and a variable condenser 274b that are connected in series. By adjusting a capacitance of the variable condenser 274b, an impedance of the variable impedance mechanism 274 may be varied. By varying the impedance of the variable impedance mechanism 274, an electric potential of the variable impedance electrode 217b, that is, the electric potential of the wafer 200, according to the plasma may be controlled. Also, a voltage measuring unit 100b for measuring a peak-to-peak voltage of the variable impedance electrode 217b is connected between the variable impedance mechanism 274 and the variable impedance electrode 217b. Data such as the peak-to-peak voltage of the variable impedance electrode 217b measured by the voltage measuring unit 100b is output to the controller 121 which is to be described later. In addition, the voltage measuring unit 100b and the variable impedance mechanism 274 are connected to the controller 121 which is to be described later.

(Control Unit)

The controller 121 serving as a control unit is configured to control the operations of the voltage measuring units 100a and 100b, the APC 242, the valve 243b, the vacuum pump 246, the pressure sensor, the susceptor elevating mechanism 268, the gate valve 244, the impedance matching device 272, the RF power source 273, the mass flow controller 242, the valve 243a, the power unit, the heater, the temperature sensor and the variable impedance mechanism 274.

(2) Substrate Processing Process

Hereinafter, a substrate processing process according to the present embodiment will be described. The substrate processing process according to the present embodiment includes nitriding the wafer 200 using the above-described substrate processing apparatus and is performed as one of processes for manufacturing a semiconductor device. Also, in the following description, an operation of each unit constituting the substrate processing apparatus is controlled by the controller 121.

(Substrate Loading Process)

Initially, the wafer 200 is loaded into the processing chamber 201 by the transfer mechanism (not shown) and mounted on the susceptor 217. Specifically, the susceptor 217 is lowered to a substrate transfer position such that a front end of the wafer elevating pin 266 penetrates the through hole 217a of the susceptor 217. In this case, the wafer elevating pin 266 protrudes from the surface of the susceptor 217 by a predetermined height. Next, the gate valve 244 is opened so that the wafer 200 is mounted on the front end of the wafer elevating pin 266 by the transfer mechanism. When the transfer mechanism is withdrawn from the processing chamber 201, the gate valve 244 is closed. Also, by elevating the susceptor 217 using the susceptor elevating mechanism 268, the wafer 200 is mounted on a top surface of the susceptor 217 and elevated to a processing position shown in FIG. 1.

The heater of the susceptor 217 is heated such that the wafer 200 reaches a predetermined processing temperature ranging from, for example, room temperature to a temperature of about 1,000° C. Also, by appropriately adjusting the opening degree of the APC 242 while simultaneously operating the vacuum pump 246, an inner pressure of the processing chamber 201 reaches a predetermined processing pressure ranging from, for example, about 0.1 to 100 Pa.

(Processes of Supplying and Exhausting Processing Gas)

When the wafer 200 is heated to the predetermined processing temperature, a supply of a processing gas into the processing chamber 201 is initiated. Specifically, the valve 243a is opened so that a $N_2$ gas as the processing gas is supplied from the gas supply source (not shown) via the mass flow controller 241 into the gas supply pipe 232. The $N_2$ gas supplied into the gas supply pipe 232 is supplied into the shower head 236 via the gas introduction port 234 so that the N₂ gas can be supplied into the processing chamber 201 via the gas outlet 239. The N₂ gas supplied into the processing chamber 201 is supplied in a shower shape toward the surface (processing surface) of the wafer 200 and exhausted from the gas exhaust pipe 231. Also, a gas flow rate of the N₂ gas ranges from, for example, about 100 to 1,000 sccm. In this case, the opening degree of a valve of the APC 242 is controlled based on the pressure detected by the pressure sensor such that the inner pressure of the processing chamber 201 reaches a predetermined processing pressure (degree of vacuum).

(Plasma Processing Process)

When the inner pressure of the processing chamber 201 is stabilized, the RF power is applied from the RF power source 273 to the plasma generation electrode 215 via the impedance matching device 272. Also, the applied RF power ranges from, for example, about 100 W to 500 W. When the RF power is applied, plasma discharge occurs in the plasma generation region 224 between the plasma generation electrode 215 and the shielding plate 240. Furthermore, the magnetron discharge occurs under an influence of the magnetic fields of the upper and lower magnets 216a and 216b, and charges are trapped in an upper space of the wafer 200 so that a high-density plasma can be generated in the plasma generation region 224. Also, the N₂ gas or an atom-state nitrogen (N) that is activated due to the generated high-density plasma is supplied onto the wafer 200 so that a surface of a thin film formed on the wafer 200 can be nitrided to form a nitride film. In this case, by adjusting the capacitance of the variable condenser 274b of the variable impedance mechanism 274, that is, by varying the impedance of the variable impedance mechanism 274, the electric potential of the wafer 200 is controlled, the amount of ions in plasma supplied to the wafer 200 is controlled, and a desired film-forming speed is obtained.

When a nitride film is formed to a desired thickness after a predetermined time lapse from the initiation of discharge, the supply of the power from the RF power source 273 to the plasma generation electrode 215 is stopped to end discharge.

(Substrate Unloading Process)

While the N₂ gas is being supplied into the processing chamber 201 in a state that the valve 243a of the gas supply pipe 232 is opened, exhausting the processing chamber 201 is continued for a predetermined time so that an unreacted gas or an intermediate product can be discharged from the processing chamber 201. Also, by controlling the opening degree of the APC 242, an inner pressure of the processing chamber 201 is equalized to an inner pressure of an adjacent vacuum transfer chamber (not shown). In addition, the wafers 200 in which processing is completed are unloaded from the processing chamber 201 in a reverse order from an order in which the wafers 200 are loaded, thereby finishing the substrate processing process according to the present embodiment.

(3) Adjustment of Film-Forming Speed

Hereinafter, a method of adjusting a film-forming speed during the above-described substrate processing process will be described.

As described above, the film-forming speed may be adjusted by adjusting the capacitance of the variable condenser 274b of the variable impedance mechanism 274, that is, by varying the impedance of the variable impedance mechanism 274. By varying the impedance of the variable impedance mechanism 274, not only the electric potential of the wafer 200 but also the peak-to-peak voltage RFVpp of the plasma generation electrode 215, the peak-to-peak voltage RFCVpp of the variable impedance electrode 217b and a peak-to-peak current RFCIpp of the variable impedance mechanism 274 are varied. Conventionally, in view of the fact that the peak-to-peak voltage of the variable impedance electrode 217b is similar to the film-forming speed, the variation in the peak-to-peak voltage RFCVpp of the variable impedance electrode 217b is monitored, and the impedance is varied based on the monitored result to control the film-forming speed.

However, the variation in the peak-to-peak voltage RFCVpp of the variable impedance electrode 217b is similar to the variation in film-forming speed within the certain range of the impedance variation, but not over the wide range of the impedance variation. Accordingly, when the variable condenser 274b of the variable impedance mechanism 274 is varied over the wide range, even if the variation in the peak-to-peak voltage RFCVpp of the variable impedance electrode 217b is monitored, controlling the film-forming speed to a desired value is difficult. Also, while it is possible to consider the peak-to-peak current RFCIpp of the variable impedance electrode 217b as a monitoring value, installing the current-measuring probe in a substrate processing apparatus may be difficult due to a large size of a current-measuring probe.

Hence, the inventors conducted research on finding parameters by which a film-forming speed may be easily controlled over the wide range within the impedance variation range. As a result, the inventors found that a variation in a reciprocal of the peak-to-peak voltage RFVpp of the plasma generation electrode 215 and the variation in film-forming speed show approximately identical increase tendency. In addition, the inventors came to a conclusion that the film-forming speed may be easily controlled over the wide range within the impedance variation range by monitoring the reciprocal of the peak-to-peak voltage RFVpp of the plasma generation electrode 215. Hereinafter, the conclusion will be described in detail.

To begin with, a voltage Vdc applied to the wafer 200 and power P consumed in the vicinity of the wafer 200 are obtained. Also, the peak-to-peak voltage RFVpp of the plasma generation electrode 215, the peak-to-peak voltage RFCVpp of the variable impedance electrode 217b, the peak-to-peak current RFCIpp of the variable impedance electrode 217b and the voltage Vdc applied to the wafer 200 are vector values.

The voltage Vdc applied to the wafer 200 is approximately obtained as shown in Equation 1 using the peak-to-peak voltage RFVpp of the plasma generation electrode 215 and the peak-to-peak voltage RFCVpp of the variable impedance electrode 217b.

$$Vdc \approx RFVpp - RFCVpp \tag{1}$$

In addition, the peak-to-peak current RFCIpp of the variable impedance electrode 217b flowing through the wafer 200 is regarded same as a current flowing through the variable impedance mechanism 274. The peak-to-peak current RFCIpp of the variable impedance electrode 217b is perpendicular to the peak-to-peak voltage RFCVpp of the variable impedance electrode 217b as shown in Equation 2.

$$RFCIpp \perp RFCVpp \tag{2}$$

Also, the power P consumed in the vicinity of the wafer 200 is proportional to the product of the voltage Vdc ($\approx$RFVpp−RFCVpp) applied to the wafer 200 and the peak-to-peak current RFCIpp of the variable impedance electrode 217b flowing through the wafer 200 as shown in Equation 3.

$$P \propto (RFVpp - RFCVpp) \cdot RFCIpp \tag{3}$$

In general, the power P is calculated by a product of a voltage vector V (hereinafter, V) expressed in Equation 4 and a current vector I (hereinafter, I) expressed in Equation 5.

Accordingly, the power P consumed in the vicinity of the wafer 200 is approximately obtained as shown in Equation 6.

$$V = (RFVpp - RFCVpp)/2 \quad (4)$$

$$I = RFCIpp/2. \quad (5)$$

$$\begin{aligned}P &= (V/\sqrt{2})\cdot(I/\sqrt{2}) \quad (6)\\ &= (1/\sqrt{2})\cdot(1/2)\cdot(RFVpp-RFCVpp)\times(1/\sqrt{2})\cdot(1/2)\cdot RFCIpp\\ &= (1/\sqrt{8})\cdot(RFVpp-RFCVpp)\times(1/\sqrt{8})\cdot RFCIpp\\ &= (1/8)\cdot|RFVpp-RFCVpp|\times|RFCIpp|\times\cos\theta\end{aligned}$$

Here, $\cos\theta$ is a power factor of the power P.

Figure 11:
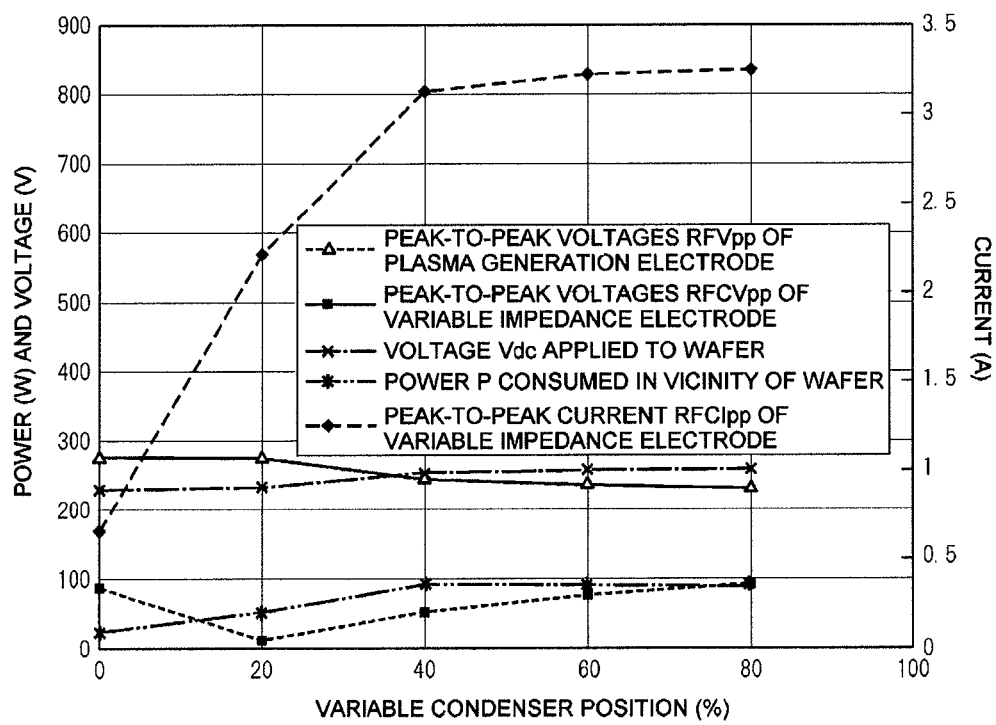
FIG. 11 is a graph showing variations in a peak-to-peak voltage of a plasma generation electrode, a peak-to-peak voltage of a variable impedance electrode, a voltage applied to a substrate, a power consumed in the vicinity of the substrate and a peak-to-peak current of a variable impedance mechanism relative to a variable condenser position.

A graph obtained by applying the voltage Vdc applied to the wafer 200 and the power P consumed in the vicinity of the wafer 200 to a case where a thin film formed on the wafer 200 is nitrided under an actual plasma processing conditions is illustrated in FIG. 11. FIG. 11 is a graph showing variations in the peak-to-peak voltage RFVpp of the plasma generation electrode 215, the peak-to-peak voltage RFCVpp of the variable impedance electrode 217b, the voltage Vdc applied to the wafer 200, the power P consumed in the vicinity of the wafer 200 and the peak-to-peak current RFCIpp of the variable impedance electrode 217b relative to a variable condenser position.

Also, the variable condenser position is a ratio of a current capacitance F of the variable condenser 274b to a maximum capacitance F of the variable condenser 274b in percentage. An abscissa denotes the variable condenser position (%), and an ordinate shows a voltage (V) and power (W). In FIG. 11, Δ denotes the peak-to-peak voltage RFVpp of the plasma generation electrode 215, ■ denotes the peak-to-peak voltage RFCVpp of the variable impedance electrode 217b, x denotes the voltage Vdc applied to the wafer 200, * denotes the power P consumed in the vicinity of the wafer 200, and ♦ denotes the peak-to-peak current RFCIpp of the variable impedance electrode 217b. In the graph of FIG. 11, the inner pressure of the processing chamber 201 is 50 Pa, a flow rate of N₂ gas is 500 sccm, a processing temperature is about 900° C., the RF power is about 200 W, and a processing time is about 60 seconds.

A graph obtained in a case where the thin film formed on the wafer 200 is nitrided under processing conditions other than in one in FIG. 11 is illustrated in FIG. 12. FIG. 12 is a graph showing variations in the peak-to-peak voltage RFVpp of the plasma generation electrode 215, the peak-to-peak voltage RFCVpp of the variable impedance electrode 217b and the film thickness (which is almost synonymous with a film-forming speed per unit time) relative to the variable condenser position. An abscissa denotes the variable condenser position (%), and an ordinate denotes a voltage (V) and a film thickness (Å). In FIG. 12, ♦ denotes the peak-to-peak voltage RFVpp of the plasma generation electrode 215, ■ denotes the peak-to-peak voltage RFCVpp of the variable impedance electrode 217b, and Δ denotes the film thickness. In the graph of FIG. 12, the inner pressure of the processing chamber 201 is 1 Pa, the flow rate of N₂ gas is 100 sccm, a processing temperature is about 400° C., an RF power is about 250 W, and a processing time is about 90 seconds.

From FIGS. 11 and 12, it is inferred that since the variation in the film thickness increases in a similar manner to the variation in the power P consumed in the vicinity of the wafer 200, the variation in film thickness has a similar relationship to a proportional relationship with the variation in the power P. Also, it can be seen that while the variation in the peak-to-peak voltage RFVpp of the plasma generation electrode 215 is different from the variation in film thickness, the peak-to-peak voltage RFVpp of the plasma generation electrode 215 and the film thickness have inverse slopes and a relationship similar to an inversely proportional relationship to each other.

Next, under the processing condition of FIG. 11, data on phase and effective values of the peak-to-peak current RFCIpp of the variable impedance electrode 217b, phase and effective values of the peak-to-peak voltage RFCVpp of the variable impedance electrode 217b, phase and effective values of the peak-to-peak voltage RFVpp of the plasma generation electrode 215, a phase value, power factor and effective value of the voltage Vdc applied to the wafer 200 and an effective value of the power P consumed in the vicinity of the wafer 200 relative to the variable condenser position are shown in Table 1. Also, a phase θ shown in Table 1 is obtained using leadings or trailings of the phase of the peak-to-peak voltage RFVpp of the plasma generation electrode 215 and the phase of the peak-to-peak voltage RFCVpp of the variable impedance electrode 217b with respect to the phase of the peak-to-peak current RFCIpp of the variable impedance electrode 217b. In addition, the voltage Vdc applied to the wafer 200 is obtained based on Equation 1.

TABLE 1

| Capacitance ratio | (%) | 0 | 20 | 40 | 60 | 80 |
|---|---|---|---|---|---|---|
| Peak-to-peak current RFCIpp of Variable impedance electrode | Phase (°) | 0 | 0 | 0 | 0 | 0 |
| | Effective value (A) | 0.67 | 2.22 | 3.13 | 3.22 | 3.24 |
| Peak-to-peak voltage RFCVpp of Variable impedance electrode | Phase (°) | −90 | −90 | 90 | 90 | 90 |
| | Effective value (V) | 88 | 11.8 | 54 | 76 | 92 |
| Peak-to-peak voltage RFVpp of Plasma generation electrode | Phase (°) | −44.94 | −41.04 | −0.11 | −7.63 | −7.63 |
| | Effective value (V) | 276.92 | 276.92 | 246.15 | 238.46 | 230.77 |
| Voltage Vdc applied to wafer | Phase (°) | −30.53 | −39.13 | −12.48 | −24.49 | −28.2 |
| | cosθ | 0.861 | 0.775 | 0.976 | 0.91 | 0.881 |
| | Effective value (V) | 227.6 | 234 | 252 | 259.7 | 259.5 |
| Power P consumed near wafer | (W) | 16.41195 | 50.32463 | 96.26691 | 95.12162 | 92.5909 |

Results of an analysis made based on FIG. 11 and Table 1 are as follows. The analysis was made by dividing the variable condenser position into three ranges, that is, less than 20%, 20% to less than 40% and 40% or more.

First, a case where the variable condenser position is less than 20% will be described. In this case, it can be seen that the peak-to-peak voltage RFCVpp of the variable impedance electrode 217b decreases toward a minima as the variable condenser position increases from 0%. It can be also seen that a phase difference between the voltage V applied to the wafer 200 and the peak-to-peak current RFCIpp of the variable impedance electrode 217b increases, and cos θ of the voltage Vdc applied to the wafer 200 is reduced. Furthermore, it can be seen that the power P consumed in the vicinity of the wafer 200 is reduced since the peak-to-peak current RFCIpp of the variable impedance electrode 217b is low.

Next, a case where the variable condenser position ranges from 20% to less than 40% will be described. In this case, it can be seen that the peak-to-peak voltage RFCVpp of the variable impedance electrode 217b increases from the minima as the variable condenser position increases from 20%. It can also be seen that a phase difference between the peak-to-peak current RFCIpp of the variable impedance electrode 217b and the peak-to-peak voltage RFCVpp of the variable impedance electrode 217b is constant. For this reason, the peak-to-peak voltage RFCVpp of the variable impedance electrode 217b and the peak-to-peak current RFCIpp of the variable impedance electrode 217b may be determined based on effective values. Accordingly, when the variable condenser position ranges from 20% to less than 40%, a film thickness may be easily controlled using an effective value (or measured value) of the peak-to-peak voltage RFCVpp of the variable impedance electrode 217b as the monitoring value.

Next, a case where the variable condenser position is 40% or more will be described. In this case, it can be seen that as the variable condenser position increases from 40%, the peak-to-peak voltage RFCVpp of the variable impedance electrode 217b increases toward a maximum value. Also, it can be seen that a phase difference between the voltage Vdc applied to the wafer 200 and the peak-to-peak current RFCIpp of the variable impedance electrode 217b increases. For this reason, cos θ of the voltage Vdc applied to the wafer 200 decreases. Furthermore, the peak-to-peak current RFCIpp of the variable impedance electrode 217b is slightly increased and almost constant, while the power P consumed in the vicinity of the wafer 200 is slightly reduced and almost constant.

Accordingly, when the variable condenser position ranges from 20% to less than 40%, an effective value of the peak-to-peak voltage RFCVpp of the variable impedance electrode 217b may be used to control a film thickness. However, when the variable condenser position is less than 20% and more than 40%, a slope tendency of the peak-to-peak voltage RFCVpp of the variable impedance electrode 217b is changed so that the effective value of the peak-to-peak voltage RFCVpp of the variable impedance electrode 217b can no longer be synchronous with the film thickness. For this reason, when an impedance of the variable impedance mechanism 274 varies, even if the peak-to-peak voltage RFCVpp of the variable impedance electrode 217b is used as the monitoring value, controlling the film thickness (or film-forming speed) to a desired value is difficult.

As described above, the peak-to-peak voltage RFVpp of the plasma generation electrode 215 and the film thickness have inverse slopes and an inversely proportional relationship to each other. Thus, the reciprocal of the peak-to-peak voltage RFVpp of the plasma generation electrode 215 is considered as the monitoring value. Also, in the following graphs of FIGS. 2 through 5, an abscissa denotes the variable condenser position (%), and an ordinate denotes an exponent.

First, the peak-to-peak voltage RFVpp of the plasma generation electrode 215, the peak-to-peak voltage RFCVpp of the variable impedance electrode 217b and the film thickness, which are actually measured when the variable condenser position is 0%, are used as reference values, and respective ratios (hereinafter, ratios) of the peak-to-peak voltage RFVpp of the plasma generation electrode 215, the peak-to-peak voltage RFCVpp of the variable impedance electrode 217b and the film thickness to the reference values are obtained. Thereafter, the peak-to-peak voltage RFVpp of the plasma generation electrode 215, the peak-to-peak voltage RFCVpp of the variable impedance electrode 217b and the film thickness, which are actually measured when the variable condenser position is 0%, are used as the reference values and respective ratios (hereinafter, reciprocal ratios) of the reference values to the peak-to-peak voltage RFVpp of the plasma generation electrode 215 and the peak-to-peak voltage RFCVpp of the variable impedance electrode 217b are obtained. Data on the ratios and the reciprocal ratios of the peak-to-peak voltage RFVpp of the plasma generation electrode 215, the ratio and the reciprocal ratios of the peak-to-peak voltage RFCVpp of the variable impedance electrode 217b and the ratio of the film thicknesses relative to the variable condenser position are shown in Table 2.

TABLE 2

| Variable condenser position (%) | Peak-to-peak voltage RFVpp of Plasma generation electrode | | | Peak-to-peak voltage RFCVpp of Variable impedance electrode | | | Film thickness | |
|---|---|---|---|---|---|---|---|---|
| | Effective Value (V) | Ratio (Exponent) | Reciprocal Ratio (Exponent) | Effective Value (V) | Ratio (Exponent) | Reciprocal Ratio (Exponent) | Measure value (Å) | Reciprocal ratio (Exponent) |
| 0 | 544 | 1 | 1 | 135 | 1 | 1 | 24.15 | 1 |
| 10 | 534 | 0.981618 | 1.018727 | 94 | 0.696296 | 1.43617 | 25.97 | 1.075362 |
| 23 | 521 | 0.957721 | 1.044146 | 39 | 0.288889 | 3.461538 | 28.87 | 1.195445 |
| 40 | 509 | 0.935662 | 1.068762 | 63 | 0.466667 | 2.142857 | 30.44 | 1.260455 |
| 70 | 502 | 0.922794 | 1.083665 | 100 | 0.740741 | 1.35 | 31.83 | 1.318012 |
| 100 | 498 | 0.915441 | 1.092369 | 115 | 0.851852 | 1.173913 | 32.28 | 1.336646 |

Figure 2:
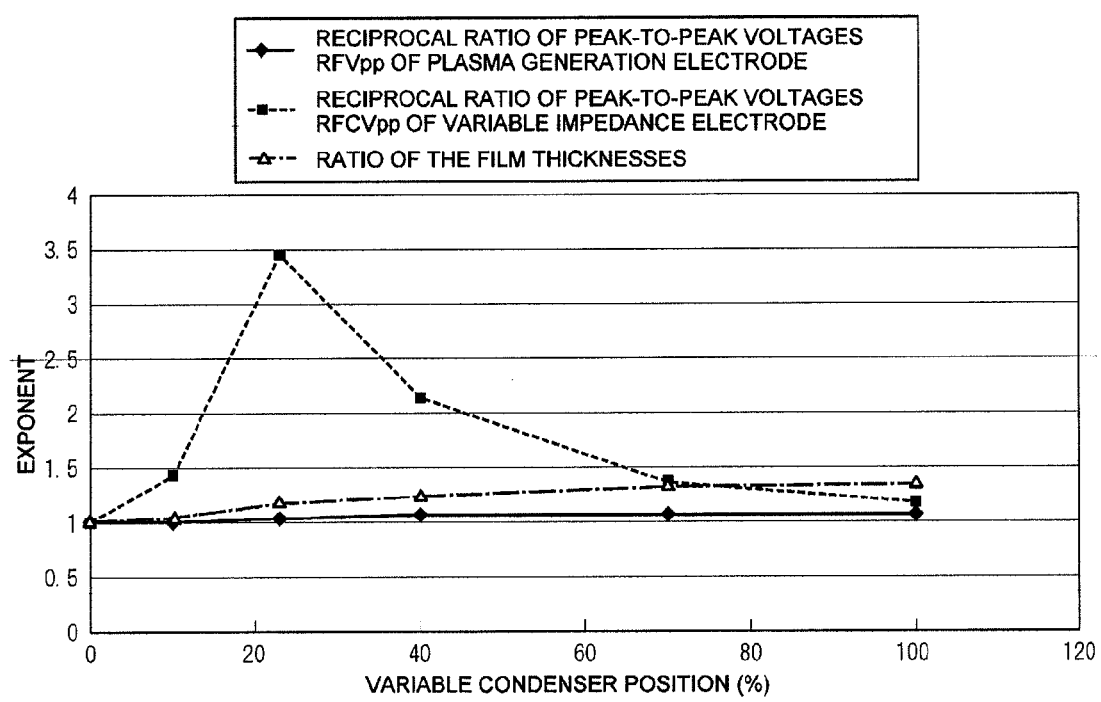
FIG. 2 is a graph showing variations in a reciprocal ratio of peak-to-peak voltages of a plasma generation electrode, a reciprocal ratio of peak-to-peak voltages of a variable impedance electrode and a ratio of a film thicknesses relative to a variable condenser position.
Figure 3:
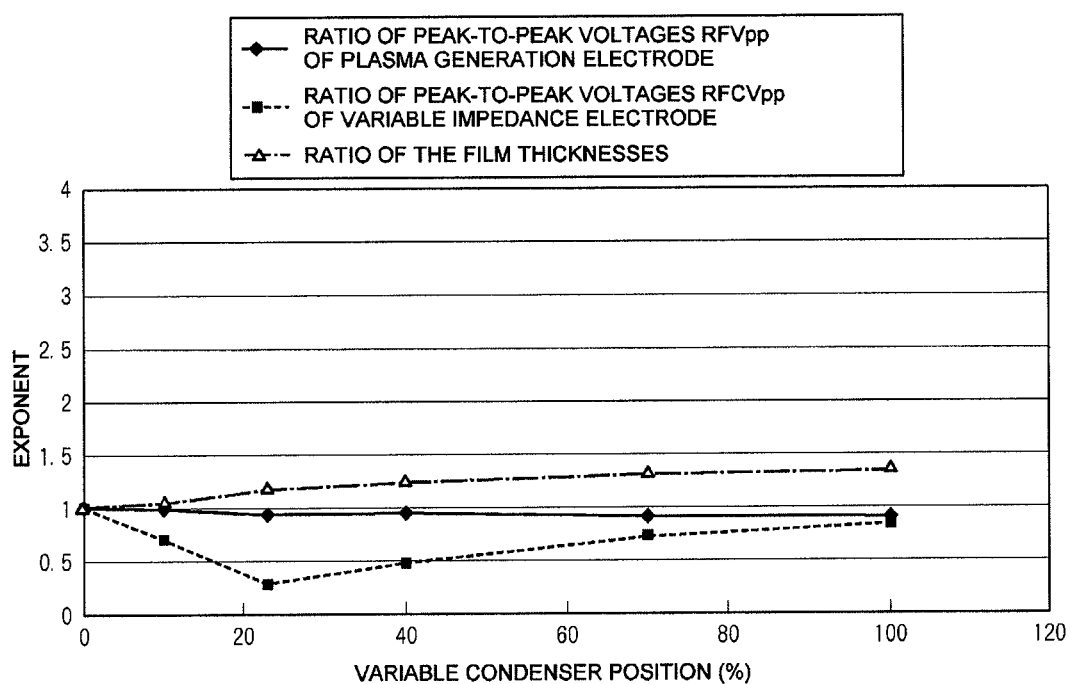
FIG. 3 is a graph showing variations in a ratio of peak-to-peak voltages of a plasma generation electrode, a ratio of peak-to-peak voltages of a variable impedance electrode and a ratio of a film thicknesses relative to a variable condenser position.

A portion of data shown in Table 2 is graphically illustrated in FIGS. 3 and 2.

FIG. 3 is a graph showing variations in the ratio of the peak-to-peak voltages RFVpp of the plasma generation electrode 215, the ratio of the peak-to-peak voltages RFCVpp of the variable impedance electrode 217b and the ratio of a film thicknesses relative to the variable condenser position. In addition, in FIG. 3, ♦ denotes the ratio of the peak-to-peak voltages RFVpp of the plasma generation electrode 215, ■ denotes the ratio of the peak-to-peak voltages RFCVpp of the variable impedance electrode 217b, and Δ denotes the ratio of the film thicknesses. As shown in FIG. 3, the variation in the ratio of the peak-to-peak voltages RFVpp of the plasma generation electrode 215 has an inverse slope to the variation in the ratio of the film thicknesses.

FIG. 2 is the graph showing variations in the reciprocal ratio of the peak-to-peak voltages RFVpp of the plasma generation electrode 215, the reciprocal ratio of the peak-to-peak voltages RFCVpp of the variable impedance electrode 217b and the ratio of the film thicknesses relative to the variable condenser position. In addition, in FIG. 2, ♦ denotes the reciprocal ratio of the peak-to-peak voltages RFVpp of the plasma generation electrode 215, ■ denotes the reciprocal ratio of the peak-to-peak voltages RFCVpp of the variable impedance electrode 217b, and Δ denotes the ratio of the film thicknesses. As shown in FIG. 2, the variation in the reciprocal ratio of the peak-to-peak voltages RFVpp of the plasma generation electrode 215 has about the same slope as the variation in ratio of the film thicknesses. Accordingly, by using the ratio of the film thicknesses and a the reciprocal ratio of the peak-to-peak voltages RFVpp of the plasma generation electrode 215, a high correlation between the film thickness and the peak-to-peak voltage may be obtained.

Also, the ratios and the reciprocal ratios are obtained in the same manner as described above based on the variable condenser position obtained when the peak-to-peak voltage RFVpp of the plasma generation electrode 215 is at the minima, for example, based on the variable condenser position of 23%. Data on the ratios and the reciprocal ratios of the peak-to-peak voltage RFVpp of the plasma generation electrode 215, the ratios and the reciprocal ratios of the peak-to-peak voltage RFCVpp of the variable impedance electrode 217b and the ratio of the film thicknesses relative to the variable condenser position are shown in Table 3.

Figure 4:
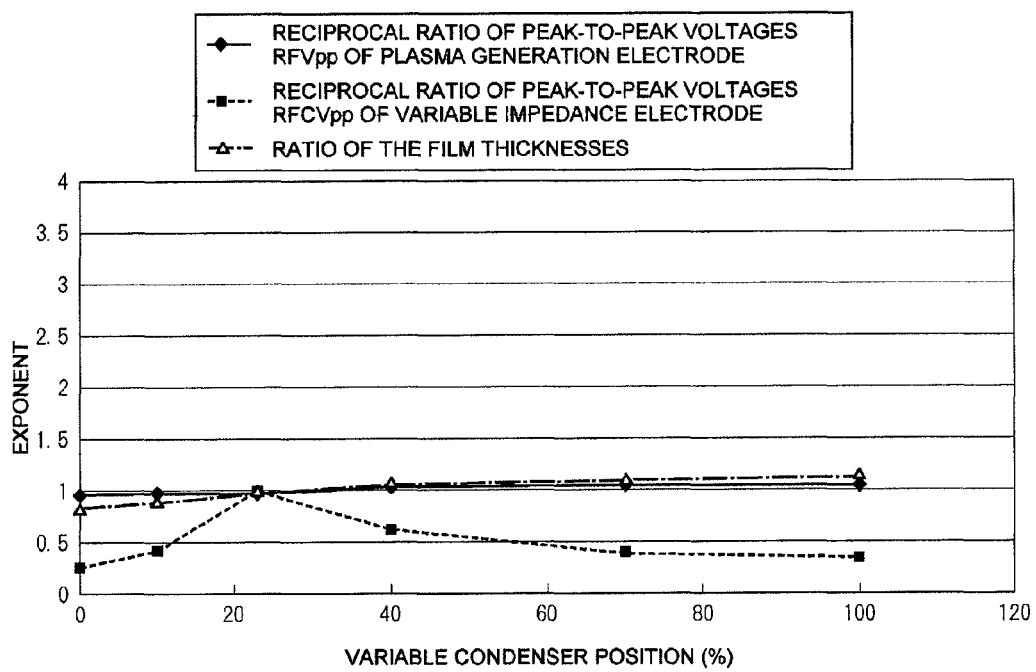
FIG. 4 is a graph showing relationships of a reciprocal ratio of peak-to-peak voltages of a plasma generation electrode, a reciprocal ratio of peak-to-peak voltages of a variable impedance electrode and a ratio of a film thicknesses relative to a variable condenser position when the peak-to-peak voltage of the plasma generation electrode is at a minima.

FIG. 4 is a graph showing relationships of the reciprocal ratio of the peak-to-peak voltages RFVpp of the plasma generation electrode 215, the reciprocal ratio of the peak-to-peak voltages RFCVpp of the variable impedance electrode 217b and the ratio of film thicknesses relative to the variable condenser position when the peak-to-peak voltage of the plasma generation electrode is at the minima. In addition, in FIG. 4, ♦ denotes the reciprocal ratio of the peak-to-peak voltages RFVpp of the plasma generation electrode 215, ■ denotes the reciprocal ratio of the peak-to-peak voltages RFCVpp of the variable impedance electrode 217b, and Δ denotes the ratio of the film thicknesses. As shown in FIG. 4, the variation in the reciprocal ratio of the peak-to-peak voltages RFVpp of the plasma generation electrode 215 is more similar to the variation in ratio of the film thicknesses than in FIG. 2. Accordingly, it can be seen that by using the reciprocal ratio of the peak-to-peak voltages RFVpp of the plasma generation electrode 215 and the ratio of the film thicknesses, which are obtained based on a case where the peak-to-peak voltage RFCVpp of the variable impedance electrode 217b is at the minima, a higher correlation between the peak-to-peak voltage RFVpp of the plasma generation electrode 215 and the film thickness may be obtained over the wide range within the variation range of the variable condenser position.

In addition, in the present embodiment, as described above, a the reciprocal ratio of two peak-to-peak voltages RFVpp of the plasma generation electrode 215 may be obtained using a method of obtaining the reference value. Depending on the substrate processing process, the minima obtained by measuring the peak-to-peak voltage RFCVpp of the variable impedance electrode 217b may be effectively used as the reference value. In this case, a pre-processing process for obtaining data is performed to specify the variable condenser position obtained when the peak-to-peak voltage RFCVpp of the variable impedance electrode 217b is at the minima. Also,

TABLE 3

| Variable Condenser Position (%) | Peak-to-peak voltage RFVpp of Plasma generation electrode | | | Peak-to-peak voltage RFCVpp of Variable impedance electrode | | | Film thickness | |
|---|---|---|---|---|---|---|---|---|
| | Effective value (V) | Ratio (Exponent) | Ratio (Exponent) | Effective ratio (V) | Ratio (Exponent) | Reciprocal ratio (Exponent) | Measure value (Å) | Ratio (Exponent) |
| 0 | 544 | 1.044146 | 0.957721 | 135 | 3.461538 | 0.288889 | 24.15 | 0.836508 |
| 10 | 534 | 1.024952 | 0.975655 | 94 | 2.410256 | 0.414894 | 25.97 | 0.89955 |
| 23 | 521 | 1 | 1 | 39 | 1 | 1 | 28.87 | 1 |
| 40 | 509 | 0.976967 | 1.023576 | 63 | 1.615385 | 0.619048 | 30.44 | 1.054382 |
| 70 | 502 | 0.963532 | 1.037849 | 100 | 2.564103 | 0.39 | 31.83 | 1.102529 |
| 100 | 498 | 0.955854 | 1.046185 | 115 | 2.9488718 | 0.33913 | 32.28 | 1.118116 |

Figure 5:
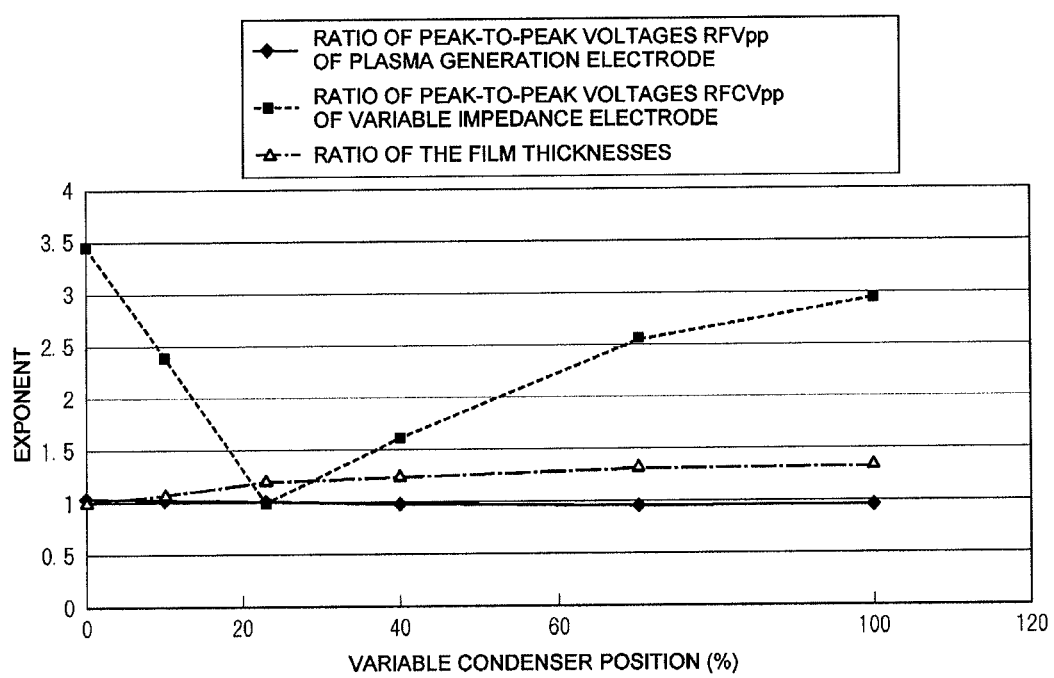
FIG. 5 is a graph showing relationships of a ratio of peak-to-peak voltages of a plasma generation electrode, a ratio of peak-to-peak voltages of a variable impedance electrode and a ratio of film a thicknesses relative to a variable condenser position when the peak-to-peak voltage of the plasma generation electrode is at a minima.

A portion of data shown in Table 3 is graphically illustrated in FIGS. 5 and 4.

FIG. 5 is a graph showing relationships of the ratio of the peak-to-peak voltages RFVpp of the plasma generation electrode 215, the ratio of the peak-to-peak voltages RFCVpp of the variable impedance electrode 217b and the ratio of film thicknesses relative to the variable condenser position when the peak-to-peak voltage RFCVpp of the plasma generation electrode 217b is at the minima. In addition, in FIG. 5, ♦ denotes the ratio of the peak-to-peak voltages RFVpp of the plasma generation electrode 215, ■ denotes the ratio of the peak-to-peak voltages RFCVpp of the variable impedance electrode 217b, and Δ denotes the ratio of the film thicknesses. As shown in FIG. 5, the variation in the ratio of the peak-to-peak voltages RFVpp of the plasma generation electrode 215 and the variation in the ratio of the film thicknesses have about the same slope as in FIG. 3.

the peak-to-peak voltage RFVpp of the plasma generation electrode 215 corresponding to the specified variable condenser position is calculated, and the reciprocal ratio is calculated based on the calculated peak-to-peak voltage RFVpp of the plasma generation electrode 215. That is, the reciprocal of the peak-to-peak voltage RFVpp of the plasma generation electrode 215 is normalized. Also, the reciprocal of the peak-to-peak voltage RFVpp of the plasma generation electrode 215 obtained during a plasma processing process is normalized in the same manner as described above to estimate a current film-forming speed. Thus, the reciprocal of the peak-to-peak voltage RFVpp of the plasma generation electrode 215 is equalized to a film-forming speed (or processing speed) over the wide range such that the film-forming speed can be easily controlled over the wide range within the impedance variation range.

(3) Effects According to the Present Embodiment

According to the present embodiment, one or more effects will be obtained, as follows.

(a) The substrate processing apparatus according to the present embodiment includes the variable impedance mechanism 274 capable of varying an impedance according to the reciprocal of the peak-to-peak voltage RFVpp of the plasma generation electrode 215. Thus, the reciprocal of the peak-to-peak voltage RFVpp of the plasma generation electrode 215 is equalized to a film-forming speed (or processing speed) over the wide range, so that the film-forming speed can be easily controlled over the wide range within the impedance variation range.

(b) According to the present embodiment, the variable impedance mechanism 274 includes the variable condenser 274b, and the controller 121 is configured to adjust the variable condenser position to vary an impedance of the variable impedance mechanism 274. Thus, an electric potential of the variable impedance electrode 217b can vary, and the electric potential of the wafer 200 with respect to plasma can be controlled. Accordingly, an amount of ions of plasma supplied to the wafer 200 can be controlled, and a desired film-forming speed can be obtained.

(c) According to the present embodiment, the controller 121 is configured to normalize the reciprocal of the peak-to-peak voltage RFVpp of the plasma generation electrode 215 obtained using the peak-to-peak voltage RFVpp of the plasma generation electrode 215 to estimate a current film-forming speed. Thus, a variation in the reciprocal ratio of the peak-to-peak voltages RFVpp of the plasma generation electrode 215 can be equalized to a variation in film thickness (or film-forming speed), and the film-forming speed can be easily controlled.

(d) According to the present embodiment, the controller 121 is configured to specify an impedance of the variable impedance electrode 215 obtained when the peak-to-peak voltage RFCVpp of the variable impedance electrode 217b is at the minima based on the previously obtained peak-to-peak voltage RFVpp of the plasma generation electrode 215 and the peak-to-peak voltage RFCVpp of the variable impedance electrode 217b, and normalize the reciprocal of the peak-to-peak voltage RFVpp of the plasma generation electrode 215 with respect to the reciprocal of the peak-to-peak voltage RFVpp of the plasma generation electrode 215 corresponding to the impedance of the variable impedance electrode 215. Thus, the reciprocal of the peak-to-peak voltage RFVpp of the plasma generation electrode 215 obtained during a plasma processing process can be normalized using the impedance obtained when the peak-to-peak voltage RFCVpp of the variable impedance electrode 217b is at the minima, and a film-forming speed can be controlled more easily.

Second Embodiment

Hereinafter, a substrate processing apparatus according to a second embodiment will be described with reference to FIG. 6. The substrate processing apparatus according to the second embodiment has the same configuration as the first embodiment except that a voltage measuring unit includes a half-wave rectifier circuit.

Figure 6:
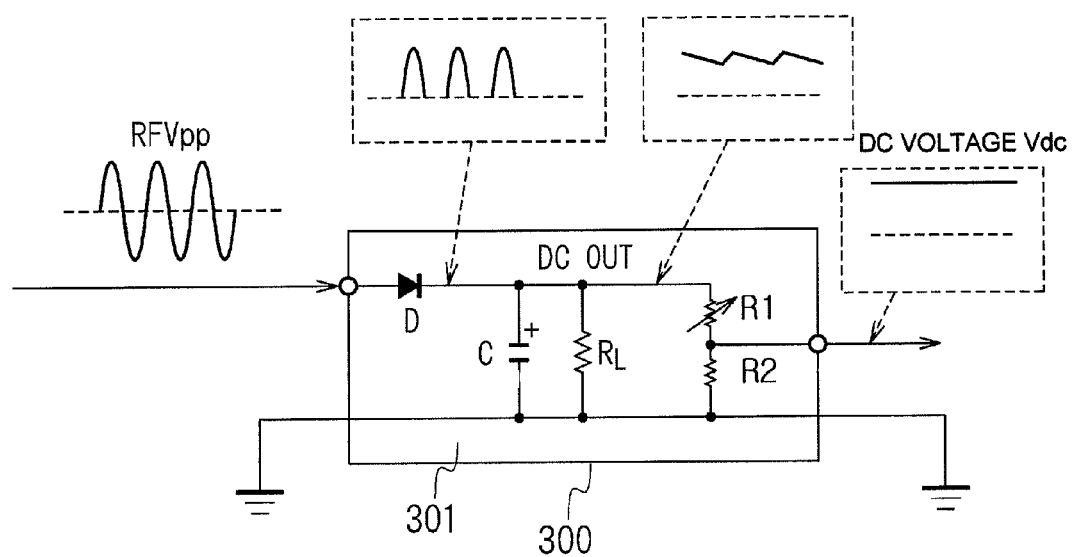
FIG. 6 is a block diagram illustrating a circuit including a voltage measuring unit according to a second embodiment of the present invention.

FIG. 6 is a block diagram of a circuit including a voltage measuring unit 300 according to the second embodiment of the present invention. As shown in FIG. 6, the voltage measuring unit 300 is connected between the plasma generation electrode 215 and the impedance matching device 272 (refer to FIG. 1) and measures the peak-to-peak voltage RFVpp of the plasma generation electrode 215. The voltage measuring unit 300 is configured to measure the peak-to-peak voltage RFVpp of the plasma generation electrode 215 by measuring a DC (direct current) voltage obtained by half-wave rectifying the peak-to-peak voltage RFVpp of the plasma generation electrode 215 by the half-wave rectifier circuit 301 included in the voltage measuring unit 300. The half-wave rectifier circuit 301 includes a diode D, a condenser C, and a resistor $R_L$. Also, a downstream side of the half-wave rectifier circuit 301 includes a variable resistor R1 and a resistor R2.

When the peak-to-peak voltage RFVpp of the plasma generation electrode 215 is applied, the half-wave rectifier circuit 301 of the voltage measuring unit 300 charges the condenser C while passing a half cycle of the alternating current using the diode D, emits power collected in the condenser C during a next half-cycle, and smoothens the power using the resistor $R_L$. The downstream side of the half-wave rectifier circuit 301 eliminates ripples from the smoothened power using the variable resistor R1 and the resistor R2 and outputs the DC voltage Vdc. As a result, the DC voltage Vdc may be measured. Furthermore, a voltage measuring unit (not shown) between the variable impedance mechanism 274 and a variable impedance electrode 217b is configured to half-wave rectify the peak-to-peak voltage RFCVpp of the variable impedance electrode 217b in the same manner as described above.

Figure 7:
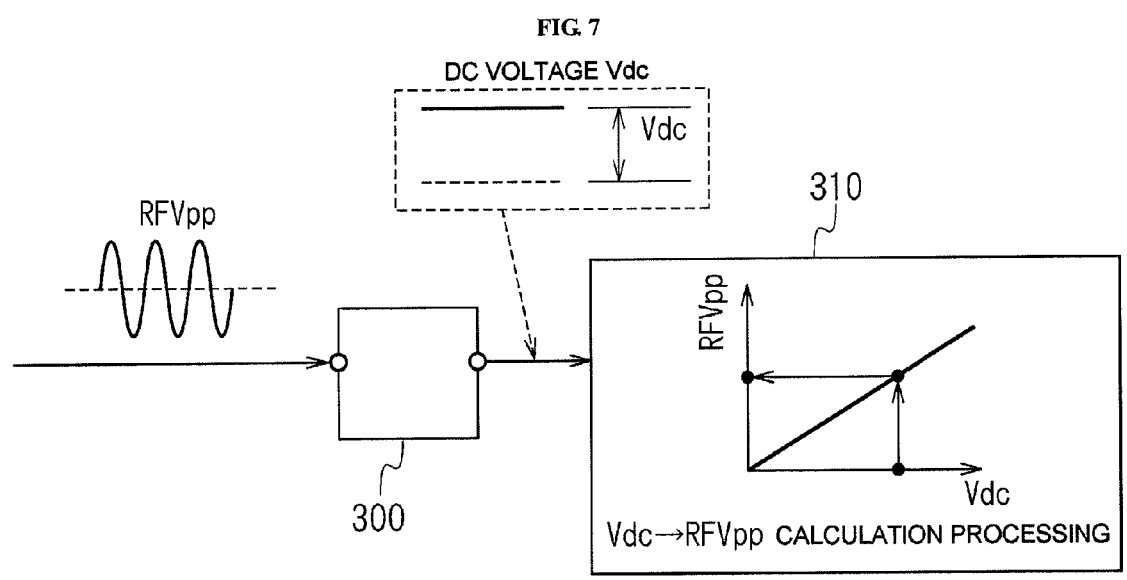
FIG. 7 is a block diagram illustrating a circuit including the voltage measuring unit and an analog input unit according to the second embodiment of the present invention.

In addition, the voltage measuring unit may convert the DC voltage Vdc into the peak-to-peak voltage RFCVpp of the variable impedance electrode 217b and the peak-to-peak voltage RFVpp of the plasma generation electrode 215. FIG. 7 is a block diagram illustrating a circuit including the voltage measuring unit 300 and an analog input unit 310 according to the second embodiment of the present invention. As shown in FIG. 7, the analog input unit 310 is installed at a downstream side of the voltage measuring unit 300. The analog input unit 310 is configured to receive the DC voltage Vdc from the voltage measuring unit 300 and convert the DC voltage Vdc into the peak-to-peak voltage RFVpp of the plasma generation electrode 215. Also, although not shown, an analog input unit is installed at a downstream side of the voltage measuring unit in the same manner and configured to receive the DC voltage Vdc and convert the DC voltage Vdc into the peak-to-peak voltage RFCVpp of the variable impedance electrode 217b. Thus, the peak-to-peak voltage RFCVpp of the variable impedance electrode 217b and the peak-to-peak voltage RFVpp of the plasma generation electrode 215 may be measured more precisely.

According to the present embodiment, the peak-to-peak voltage RFCVpp of the variable impedance electrode 217b and the peak-to-peak voltage RFVpp of the plasma generation electrode 215 may be measured more precisely, and a deviation (difference) in measurements caused by individual differences between measuring devices may be reduced. Moreover, components of the half-wave rectifier circuit include commercialized products such as the resistor $R_L$, the diode D, and the condenser C. Thus, even if production of a single component stops, the half-wave rectifier circuit may be used over a long period of time by replacing the component with a substitute having equal performance. Accordingly, the influence of the individual differences between measuring devices may be reduced, thereby enabling a cost reduction.

In addition, conventionally, the peak-to-peak voltage RFVpp of the plasma generation electrode 215 and the peak-to-peak voltage RFCVpp of the variable impedance electrode 217b are measured using an oscilloscope sold in the market and used as monitoring values. Since the oscilloscope has a degree of precision of, for example, ±24V (when the oscilloscope is set to 100V/div), a reproducibility of measurements was occasionally degraded. Moreover, when a ratio of a maximum measured value to a minimum measured value ranges from, for example, about 10 to 50, a high degree of precision of measurement could not be obtained occasionally due to a large variation range of the measured values.

Third Embodiment

Hereinafter, a substrate processing apparatus according to a third embodiment will be described with reference to FIG. 8. The substrate processing apparatus according to the third embodiment has the same configuration as the above-described embodiments except that a voltage measuring unit includes an averaging circuit.

Figure 8:
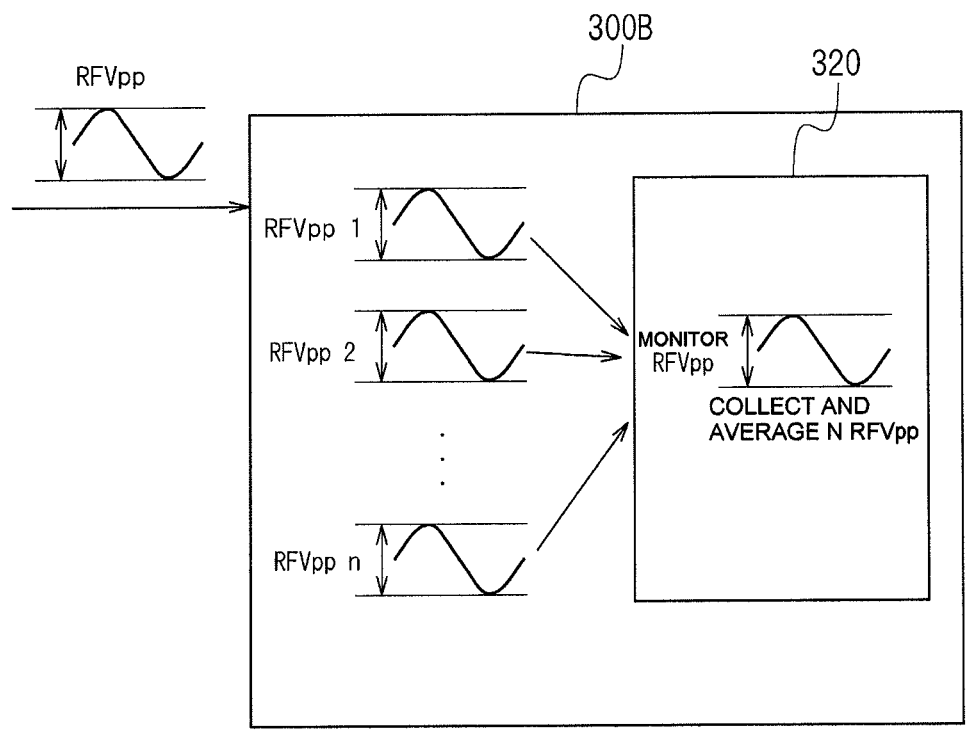
FIG. 8 is a block diagram illustrating a circuit including a voltage measuring unit according to a third embodiment of the present invention.

FIG. 8 is a block diagram illustrating a circuit including a voltage measuring unit 300B according to the third embodiment of the present invention. As shown in FIG. 8, the voltage measuring unit 300B is connected between the plasma generation electrode 215 and the impedance matching device 272 (refer to FIG. 1) and measures the peak-to-peak voltage RFVpp of the plasma generation electrode 215. The voltage measuring unit 300B measures an average of the peak-to-peak voltage RFVpp of the plasma generation electrode 215 obtained by measuring a plurality of times (n times in FIG. 8) and averaging the peak-to-peak voltage RFVpp of the plasma generation electrode 215 by an averaging circuit 320. Specifically, the voltage measuring unit 300B retains n peak-to-peak voltages RFVpp of the plasma generation electrode 215 and averages the n peak-to-peak voltages RFVpp using the averaging circuit 320. In addition, the voltage measuring unit 300B measures the averaged peak-to-peak voltage RFVpp of the plasma generation electrode 215 as the monitoring value. By repetitively performing this averaging process, a series of measurements of the peak-to-peak voltages RFVpp of the plasma generation electrode 215 are obtained. Furthermore, a voltage measuring unit (not shown) connected between the variable impedance mechanism 274 and a variable impedance electrode 217b is configured to average the peak-to-peak voltages RFCVpp of the variable impedance electrode 217b.

According to the present embodiment, the n peak-to-peak voltages RFCVpp of the variable impedance electrode 217b and the n peak-to-peak voltages RFVpp of the plasma generation electrode 215 are processed such that the influence of earth instability or external noise can be reduced and the peak-to-peak voltages RFVpp of the plasma generation electrode 215 and the peak-to-peak voltages RFCVpp of the variable impedance electrode 217b can be stably monitored.

Other Embodiments of the Present Invention

The present invention is not limited to an MMT apparatus described in the above-described embodiments, but other apparatuses, for example, an inductively-coupled plasma (ICP) apparatus and an electron-cyclotron-resonance (ECR) apparatus, may be used.

Figure 9:
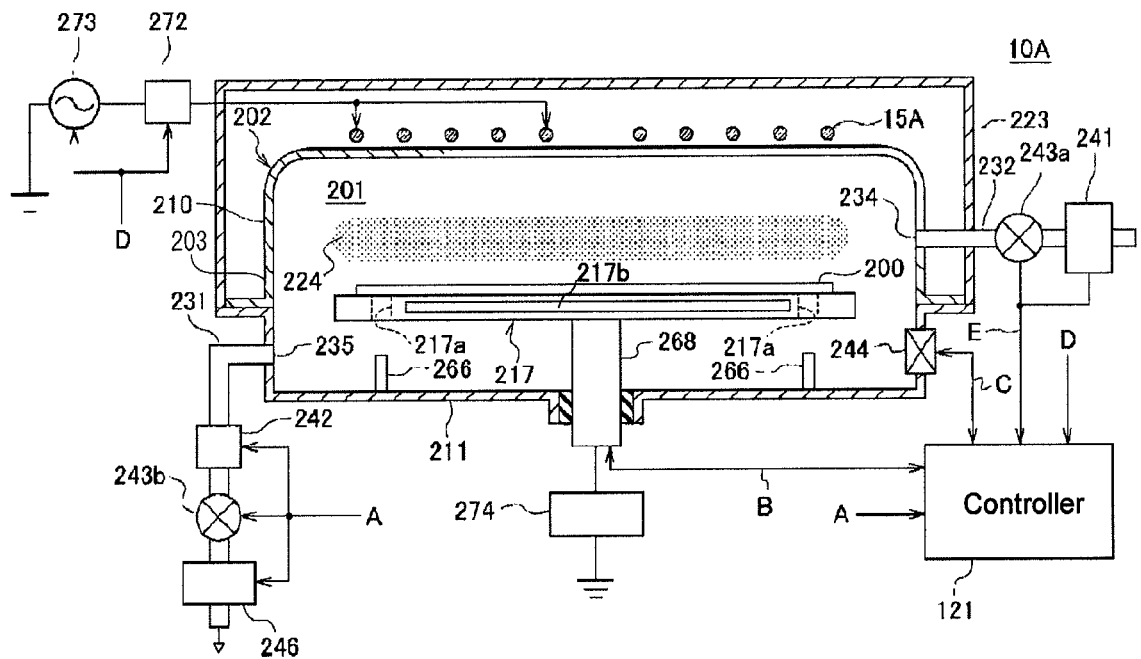
FIG. 9 is a longitudinal sectional view of an ICP-type plasma processing apparatus as a substrate processing apparatus according to another embodiment of the present invention.

FIG. 9 illustrates an ICP-type plasma processing apparatus 10A as a substrate processing apparatus according to another embodiment of the present invention. A detailed description of a configuration according to the present embodiment is omitted while denoting components having the same functions by the same reference numerals. The ICP-type plasma processing apparatus 10A according to the present embodiment includes an induction coil 15A as a plasma generation unit to which power is supplied to generate plasma. The induction coil 15A is attached to the outside of a ceiling of a processing container 203. In the present embodiment, $N_2$ gas as a processing gas is supplied from a gas supply pipe 232 via a gas introduction port 234 to the processing container 203. Also, when RF power is applied to the induction coil 15A as the plasma generation unit, an electric field is generated due to electromagnetic induction. The supplied $N_2$ gas is brought into a plasma state due to the generated electric field so that, for example, a nitridation process may be performed. Furthermore, in the present embodiment, a controller 121 is configured to calculate a the reciprocal of the peak-to-peak voltage RFVpp of the plasma generation electrode 215 applied to the induction coil 15A from the peak-to-peak voltage RFVpp of the plasma generation electrode 215 to estimate a current film-forming speed and vary an impedance of the variable impedance mechanism 274 based on a difference between the current film-forming speed and a desired film-forming speed.

Figure 10:
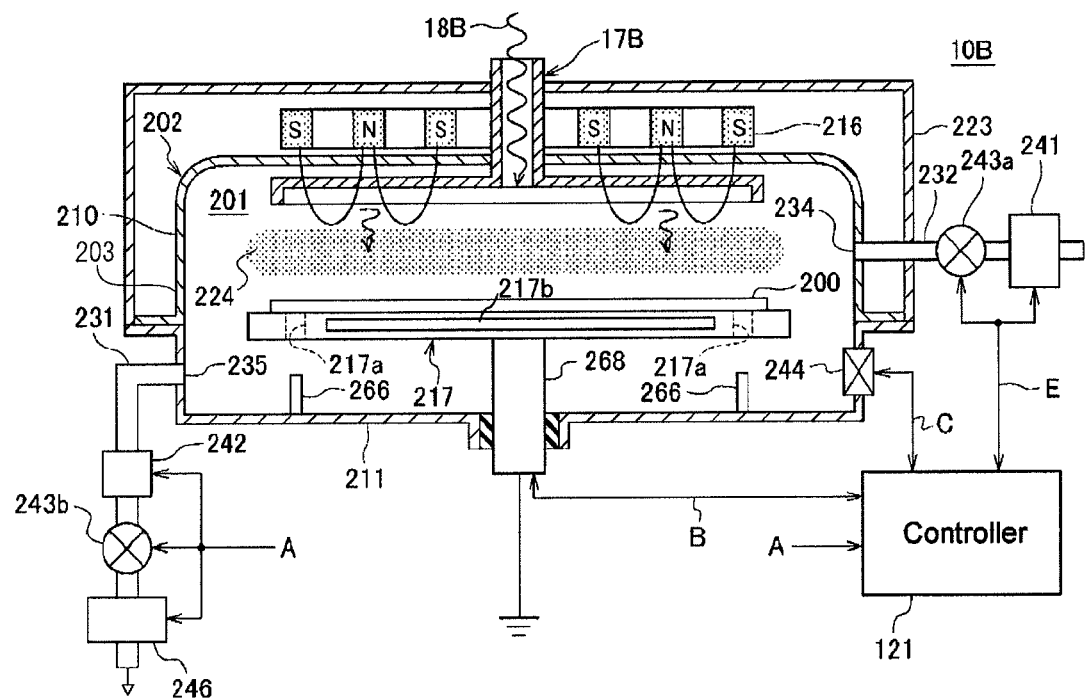
FIG. 10 is a longitudinal sectional view of an ECR-type plasma processing apparatus as a substrate processing apparatus according to yet another embodiment of the present invention.

FIG. 10 illustrates an ECR-type plasma processing apparatus 10B as a substrate processing apparatus according to still another embodiment of the present invention. A detailed description of a configuration according to the present embodiment is omitted while denoting components having the same functions as in the above-described embodiments by the same reference numerals. The ECR-type plasma processing apparatus 10B according to the present embodiment includes a micro-wave introduction pipe 17B for supplying microwaves to convert a processing gas to be in a plasma state. In the present embodiment, $N_2$ gas as the processing gas is supplied from a gas supply pipe 232 via a gas introduction pipe 234 into a processing container 203. Also, microwaves 18B are introduced from a micro-wave generation source (not shown) into the micro-wave introduction pipe 17B and emitted into a processing chamber 201. The supplied $N_2$ gas is brought into a plasma state due to the micro-waves 18B so that, for example, a nitridation process may be performed. Also, in the present embodiment, a controller 121 is configured to calculate a the reciprocal of the peak-to-peak voltage RFVpp of micro-wave power (not shown) from the peak-to-peak voltage RFVpp of the micro-wave power to estimate a current film-forming speed and vary an impedance of the variable impedance mechanism 274 based on a difference between the current film-forming speed and a desired film-forming speed.

In addition, the above-described embodiment is applied to a case where a thin film formed on the wafer 200 is nitrided, but the present invention is not limited thereto and may be preferably applied to other substrate processing processes, for example, an oxidation process, a carbonization process, film forming processes, such as a chemical vapor deposition (CVD) process, an atomic layer deposition (ALD) process, or a physical vapor deposition (PVD) process, a diffusion process and an annealing process.

Furthermore, the present invention is not limited to a substrate processing apparatus for processing a wafer as a substrate according to the present embodiment and may be preferably applied to a substrate processing apparatus, such as a printed circuit board (PCB), a liquid crystal panel, a magnetic disc, or a compact disc.

While the present invention has been particularly shown and described with reference to the above-described embodiments, the present invention is not limited to the above-described embodiments and various changes in form and details may be made therein without departing from the spirit and scope of the present invention.

Preferred Embodiments of the Present Invention

Hereinafter, the preferred embodiments of the present invention will be further described in detail.

A first embodiment of the present invention provides a substrate processing apparatus comprising: a processing chamber configured to process a substrate; a substrate support unit configured to support the substrate in the processing chamber; a processing gas supply unit configured to supply a processing gas into the processing chamber; a plasma generation electrode configured to convert the processing gas supplied into the processing chamber to be in a plasma state; a radio frequency power source configured to apply a radio frequency power to the plasma generation electrode; a variable impedance electrode installed at the substrate support unit and configured to control an electric potential of the substrate; a variable impedance mechanism connected to the variable impedance electrode and configured to vary an impedance according to a reciprocal of a peak-to-peak voltage of the plasma generation electrode; an exhaust unit configured to exhaust an atmosphere in the processing chamber; and a controller configured to control at least the variable impedance mechanism.

Preferably, the variable impedance mechanism includes a variable condenser, and the controller adjusts a capacitance of the variable condenser to vary the impedance.

More preferably, the controller normalizes the reciprocal of the peak-to-peak voltage of the plasma generation electrode to estimate a current processing speed.

More preferably, the controller specifies an impedance of the variable impedance electrode obtained when the peak-to-peak voltage of the variable impedance electrode is at the minima based on a previously obtained peak-to-peak voltage of the plasma generation electrode and a previously obtained peak-to-peak voltage of the variable impedance electrode, and normalize a reciprocal of the peak-to-peak voltage of the plasma generation electrode with respect to a reciprocal of the peak-to-peak voltage of the plasma generation electrode corresponding to the impedance of the variable impedance electrode.

More preferably, the substrate processing apparatus further includes a voltage measuring unit configured to measure the peak-to-peak voltage of the plasma generation electrode, wherein the voltage measuring unit measures a DC voltage obtained by half-wave rectifying the peak-to-peak voltage of the plasma generation electrode by a half-wave rectifier circuit included in the voltage measuring unit.

More preferably, the substrate processing apparatus further includes a voltage measuring unit configured to measure the peak-to-peak voltage of the plasma generation electrode, wherein the voltage measuring unit measures an average of the peak-to-peak voltage of the plasma generation electrode obtained by measuring and averaging the peak-to-peak voltage of the plasma generation electrode a plurality of times by an averaging circuit included in the voltage measuring unit.

More preferably, the substrate processing apparatus further includes a second voltage measuring unit configured to measure a peak-to-peak voltage of the variable impedance electrode, wherein the second voltage measuring unit measures a DC voltage obtained by half-wave rectifying the peak-to-peak voltage of the variable impedance electrode by a half-wave rectifier circuit included in the second voltage measuring unit.

More preferably, the substrate processing apparatus further includes a second voltage measuring unit configured to measure a peak-to-peak voltage of the variable impedance electrode, wherein the second voltage measuring unit measures an average of the peak-to-peak voltage of the variable impedance electrode obtained by measuring and averaging the peak-to-peak voltage of the variable impedance electrode a plurality of times by an averaging circuit included in the voltage measuring unit.

A second embodiment of the present invention provides a method of manufacturing a semiconductor device including steps of: converting, by a plasma generation unit, a processing gas supplied into a processing chamber to be a plasma state with a capacitance of a variable condenser set according to a reciprocal of a peak-to-peak voltage of a variable impedance mechanism to control the variable impedance mechanism to a desired impedance; exposing a substrate in the processing chamber and processing the substrate to the plasma; and unloading the processed substrate from the processing chamber.

What is claimed is:

1. A substrate processing apparatus comprising:
a processing chamber configured to process a substrate;
a substrate support unit configured to support the substrate in the processing chamber;
a processing gas supply unit configured to supply a processing gas into the processing chamber;
a plasma generation electrode configured to convert the processing gas supplied into the processing chamber to be in a plasma state;
a radio frequency power source configured to apply a radio frequency power to the plasma generation electrode;
a variable impedance electrode installed at the substrate support unit and configured to control an electric potential of the substrate;
a variable impedance mechanism connected to the variable impedance electrode and configured to vary an impedance according to a reciprocal of a peak-to-peak voltage of the plasma generation electrode;
an exhaust unit configured to exhaust an atmosphere in the processing chamber; and
a controller configured to control at least the variable impedance mechanism.

2. The apparatus of claim 1, wherein the variable impedance mechanism includes a variable condenser, and the controller adjusts a capacitance of the variable condenser to vary the impedance.

3. The apparatus of claim 2, wherein the controller normalizes the reciprocal of the peak-to-peak voltage of the plasma generation electrode to estimate a current processing speed.

4. The apparatus of claim 1, wherein the controller normalizes the reciprocal of the peak-to-peak voltage of the plasma generation electrode to estimate a current processing speed.

5. The apparatus of claim 1, further comprising a voltage measuring unit configured to measure the peak-to-peak voltage of the plasma generation electrode,
wherein the voltage measuring unit measures a DC voltage obtained by half-wave rectifying the peak-to-peak voltage of the plasma generation electrode by a half-wave rectifier circuit included in the voltage measuring unit.

6. The apparatus of claim 5, further comprising a second voltage measuring unit configured to measure a peak-to-peak voltage of the variable impedance electrode,
wherein the second voltage measuring unit measures a DC voltage obtained by half-wave rectifying the peak-to-peak voltage of the variable impedance electrode by a half-wave rectifier circuit included in the second voltage measuring unit.

7. The apparatus of claim 1, further comprising a voltage measuring unit configured to measure the peak-to-peak voltage of the plasma generation electrode,
wherein the voltage measuring unit measures an average of the peak-to-peak voltage of the plasma generation electrode obtained by measuring and averaging the peak-to-peak voltage of the plasma generation electrode a plurality of times by an averaging circuit included in the voltage measuring unit.

8. The apparatus of claim 7, further comprising a second voltage measuring unit configured to measure a peak-to-peak voltage of the variable impedance electrode, wherein the second voltage measuring unit measures an average of the peak-to-peak voltage of the variable impedance electrode obtained by measuring and averaging the peak-to-peak voltage of the variable impedance electrode a plurality of times by an averaging circuit included in the voltage measuring unit.

9. The apparatus of claim 1, further comprising a second voltage measuring unit configured to measure the peak-to-peak voltage of the variable impedance electrode, wherein the second voltage measuring unit measures a DC voltage obtained by half-wave rectifying the peak-to-peak voltage of the variable impedance electrode by a half-wave rectifier circuit included in the second voltage measuring unit.

10. The apparatus of claim 1, further comprising a second voltage measuring unit configured to measure the peak-to-peak voltage of the variable impedance electrode, wherein the second voltage measuring unit measures an average of the peak-to-peak voltage of the variable impedance electrode obtained by measuring and averaging the peak-to-peak voltage of the variable impedance electrode a plurality of times by an averaging circuit included in the voltage measuring unit.

* * * * *